United States Patent [19]

Sakai et al.

[11] Patent Number: 4,692,606

[45] Date of Patent: Sep. 8, 1987

[54] MODULATED LIGHT SOURCE WITH POWER STABILIZED ACCORDING TO DATA SIGNAL

[75] Inventors: Mitsugu Sakai; Shoji Yoshikawa, both of Hachioji, Japan

[73] Assignee: Olympus Optical Company, Tokyo, Japan

[21] Appl. No.: 785,911

[22] Filed: Oct. 9, 1985

[30] Foreign Application Priority Data

Oct. 9, 1984 [JP] Japan .............................. 59-212357

[51] Int. Cl.⁴ .............................................. G01J 1/32
[52] U.S. Cl. .................................................. 250/205
[58] Field of Search ................... 250/205, 214 C, 238; 455/618; 372/34

[56] References Cited

U.S. PATENT DOCUMENTS 4,307,469 12/1981 Casper et al. ....................... 455/613
4,369,525 1/1983 Breton et al. ..................... 372/30 X Primary Examiner—Eugene R. LaRoche
Assistant Examiner—David Mis
Attorney, Agent, or Firm—Robert E. Burns; Emmanuel J. Lobato

[57] ABSTRACT

An optical power stabilizing device for use in information recording and reproducing apparatus is disclosed. The device comprises a light source for generating light power in accordance with input signals, a photodetecting means coupled to the light source for detecting at least a part of the light power of the light source to generate a photodetected signal, a signal source for generating the input signals, an external control means connected to the signal source for selecting modes of the input signals, means for generating a control reference signal by processing the input signals, means for generating at least one control signal by processing the photodetected signal and the control reference signal, and means for driving the light source in accordance with the control signals.

11 Claims, 5 Drawing Figures

MODULATED LIGHT SOURCE WITH POWER STABILIZED ACCORDING TO DATA SIGNAL

BACKGROUND OF THE INVENTION

The present invention relates to an optical power stabilizing device for always generating a desired stabilized light power from a light source without subjecting to the effect of change in ambient temperature or deterioration of the light source, which generate a light output power in accordance with input signals such as a pulse signal, an analog signal or the like.

As an optical sensor, a control technology and an information processing technology utilizing light are developed, it is important to use a stabilized light power obtained by a light source. Generally, the optical power must be utilized in such a manner that not only a constant light power is continuously generated (hereinafter referred to as a continuous light), but also a pulsatory light or a modulated light (hereinafter referred to as a modulated light) is generated in accordance with its aim. In this case, these kinds of light are utilized by combinning them with time or by superimposing them on each other. While there are many kinds of light sources such as a semiconductor laser element, a discharge tube or the like which have respective inherent characteristic of light power and dependency of ambient temperature change or deterioration of element.

Particularly, the light source such as a semiconductor device, a discharge tube or the like has a nonlinear light power characteristics with respect to the drive current (voltage) for the light source. The non-linear characteristics of the light output power is to be understood to mean a curved line characteristics which show zero or very weak light output power at very small drive current (voltage) and an abruptly increased light output power as the drive current (voltage) is increased. In order to obtain stabilized light output power from the light source having such a non-linear characteristics of the light output power, it is necessary to perform the stabilization of the light output power by controlling the drive current (voltage) suitably before and after a knee point of the curved line. As a typical light source having the nonlinear characteristic of the light output power, a semiconductor laser element is described by way of example with reference to the drawings, corresponding elements having been given the same reference numerals.

As shown in FIG. 1, the semiconductor laser element exhibits a non-linear characteristic of the light output power having a curved line portion with respect to a drive current I. The knee point is, generally, defined by a threshold current $I_{th}$ and the slope of a steep rising portion after the knee point is defined by a differential quantum efficiency $\eta$. The light power characteristics of such a semiconductor laser element exhibits an increase of the threshold current $I_{th}$ and a decrease of the differential quantum efficiency $\eta$ due to an increase in ambient temperature of the laser element or a deterioration of the element. Such a variation of the light power characteristic is shown in FIG. 1 by $C_1$ and $C_2$. The effect of the temperature dependency or the deterioration dependency on such a light power characteristic is remarkable when the semiconductor laser element is driven by a pulse current to obtain a pulsatory light power. FIG. 1 also shows such an effect by light powers $P_1$ and $P_2$. This is the case that the semiconductor laser element is used as a light source of an optical memory device, the readout of the stored information is performed by a weak continuous oscillation mode of the laser element caused by a DC current $I_R$, and the writing or erasing of information is performed by a strong pulse oscillation mode caused by a pulse current $I_W$. As is seen from FIG. 1, when the light power characteristic is changed from $C_1$ to $C_2$ due to the deterioration and temperature rise of the laser element, the continuous oscillation mode (output component corresponding to the DC current $I_R$) for readout can not often be obtained.

An optical power stabilizing device for generating a stabilized light power from a light source having such a non-linear characteristic has been proposed and disclosed in Japan Patent Laid-open No. 59-78588. Even in this case, however, the light power from the light source can only be stabilized by the detected output of an optical detector. Particularly, a biasing light quantity is changed by a peak value of the detected output, so that there are some problems unsolved, such as the necessity of controlling light power of the continuous light at a desired level with stability, the difficulty in following to duty change of the pulse signal, or the like.

SUMMARY OF THE INVENTION

It is an object of the present invention to resolve the above problems of the conventional optical power stabilizing device.

It is another object of the present invention to provide an optical power stabilizing device capable of stabilizing the light power for the continuous light, the modulated light and a combination thereof.

According to the present invention there is provided an optical power stabilizing device comprising means for generating input signals, a light source for generating a light power in accordance with input signal (for example, pulse signal), means for generating a control reference signal by subjecting the input signal to a smoothing process, means for detecting a part of emitted power of the light source to generate a photodetected signal, means for generating a control signal by subjecting the control reference signal and the photodetected signal to a signal processing, and means for driving the light source, thereby generating a continuous light, a modulated light, and a combination thereof.

DESCRIPTION OF THE PREFERRED EMBODIMENT

Figure 1:
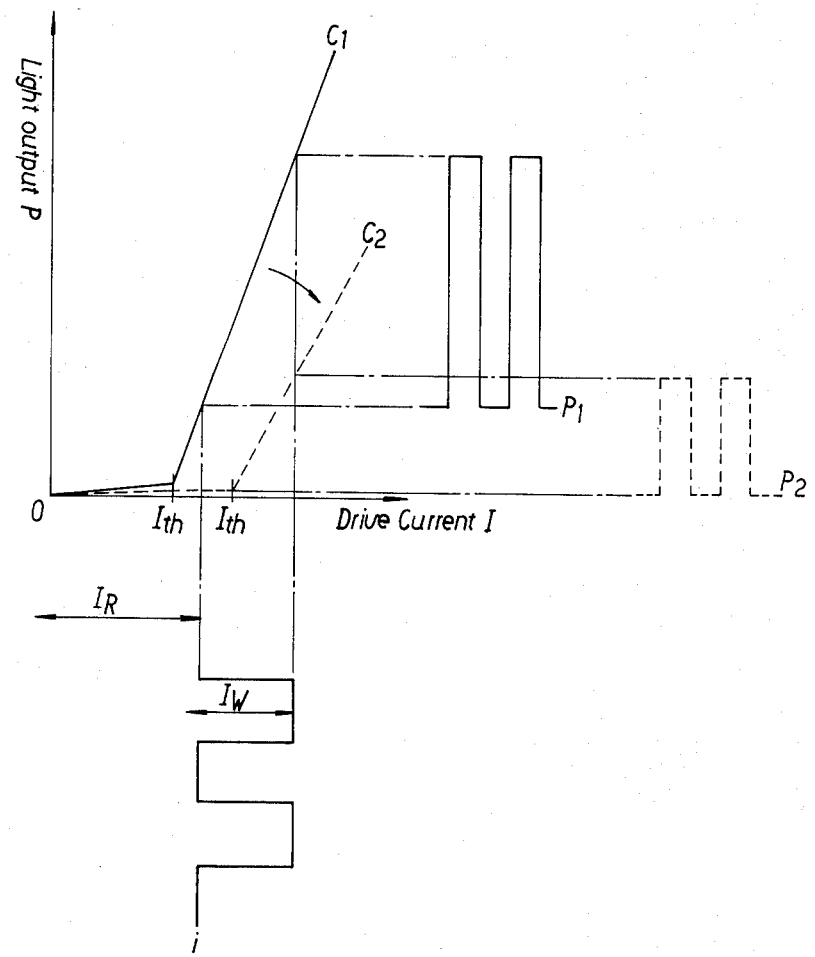
FIG. 1 is a diagrammatic view showing a light power characteristic of a light source having non-linear power, such as a semiconductor laser element.

Referring now to the drawing, wherein like reference characters designate like or corresponding parts throughout the several views, there is shown an optical output or power stabilizing device according to the present invention.

Figure 2:
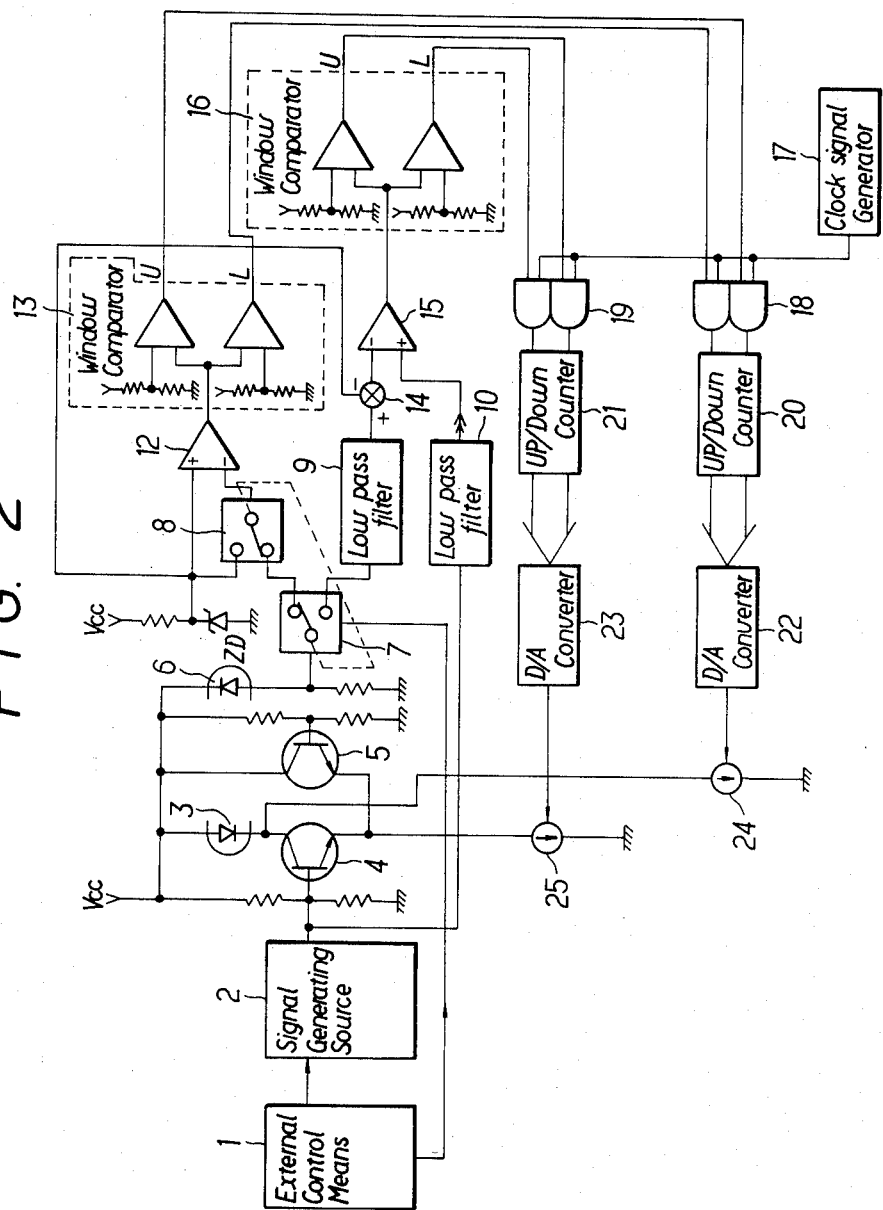
FIG. 2 is a circuit diagram showing one embodiment of an optical power stabilizing device according to the present invention.

FIG. 2 shows one embodiment of an optical power stabilizing device according to the present invention. Reference numeral 1 is an external controlling means for selecting modes (for example, pulsatory light mode or continuous light mode) of input signal for the optical power stabilizing device. Such a controlling means may be a control means for performing an instruction such as writing or reading out in an optical information recording and reproducing apparatus. The output of the control means 1 is connected to a signal source 2 for generating an input signal for the optical power stabilizing device. Reference numeral 3 is a light source, such as a semiconductor laser element, 4 is a driving transistor connected to the semiconductor laser element 3, 5 is a transistor connected across a series combination of the laser 3 and the transistor 4, 6 is an optical or photo detector such as a PIN photodetector which is provided in the same package as the laser element 3 and monitors the light output power thereof, and 7, 8 are interlocked analog switches for selecting and connecting, in accordance with the instruction of the control means 1, the outputs of the photo detector 6 to circuit elements which constitute means for generating control signals. Reference numeral 9 is a low-pass filter for the output signal of the photo detector, 10 is a low-pass filter for the input signal, 11 is a Zener diode for generating a reference signal, 12 is a differential amplifier which receives the reference signal and the photodetected signal, 13 is a window comparator connected to the amplifier 12, 14 is a subtractor for generating a difference between the reference signal and the output of the filter 9, 15 is a differential amplifier which receives output of the filter 10 and the subtractor 14, 16 is window comparator connected to the amplifier 15, 17 is a clock signal, generator, 18 is an AND gate circuit connected to the generator 17 and the window comparator 13, 19 is an AND gate circuit connected to the generator 17 and the window comparator 16, 20, 21 are up/-down counters connected to the AND gate circuits 18 and 19, respectively, 22, 23 are D/A converters for converting digital outputs of the counters 20, 21 into analog signal, and 24, 25 are constant current sources for supplying driving current to the semiconductor laser element 3 by adjusting set current in accordance with the output of the D/A converters 23 and 24. These circuit elements 1 to 25 are arranged and connected to each other as shown in FIG. 2.

In operation, the input signal derived from the signal source 2 by the instruction of the control means 1 is supplied to the transistor 4 and the low-pass filter 10. The transistor 4 serves as a current switch for the laser element 3 together with the transistor 5. These transistors 4 and 5 become ON and OFF states alternately. The laser element 3 receives driving currents from the current source 24 directly and the current source 25 through the transistor 4. These constant current sources 24 and 25 are capable of changing the set current thereof. A part of the emitted light of the laser element 3 is detected by the photodetector 6. The output of the detector 6 is supplied, through the analog switch 7 which is controlled by the output of the control means 1, to the analog switch 8 at the low power oscillation of the laser 3 and to the low-pass filter 9 at the high power oscillation of the pulsatory oscillation of the laser 3. The switch 8 is interlocked with the switch 7 and supplies the output of the photodetector 6 to the inverted input of the differential amplifier 12 at the low power oscillation of the laser 3. The non-inverted input of the amplifier 12 receives the reference voltage of the zener diode 11. The differential amplifier 12 detects a difference between a reference emission quantity and the emitted quantity of the laser 3 at the low power oscillation thereof. The window comparator 13 compares the output of the amplifier 12 with the set upper and lower limits to generate a signal having an inverse polarity which is supplied to the AND gate 18 together with the clock signal. The outputs of the AND gate 18 are supplied to the current source 24 through the counter 20 and the D/A converter 22, thereby feedback-controlling the driving current of the laser element 3.

Figure 3:
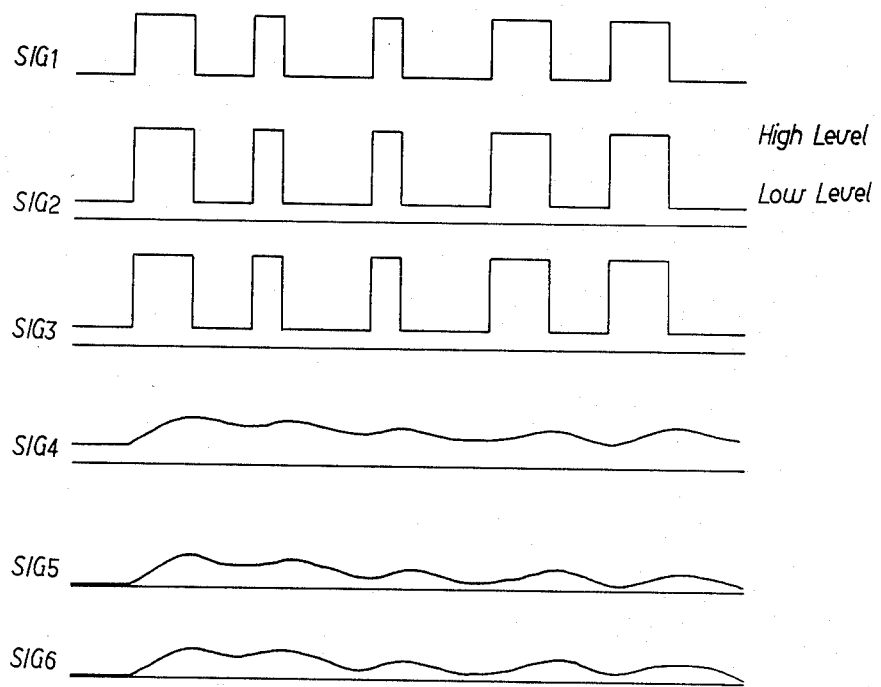
FIG. 3 is a waveform chart explaining operation of the device shown in FIG. 2.

At the pulsatory oscillation of the laser 3, the input signal derived from the signal source 2 by the instruction of the control means 1 is a pulse signal so that the transistors 4 and 5 become alternately ON and OFF states. Even when the transistor 4 becomes ON and OFF states the laser element 3 may receive a certain current from the current supply source 24. In this mode, the photodetected signal is supplied to the low-pass filter 9 through the switch 7. The low-pass filter 9 has a time constant few tens times larger than the minimum period of the incoming pulse signal so that the photodetected signal is smoothed (refer to FIG. 3 SIG 4) and the low power component thereof can be removed by the subtractor 14 (refer to FIG. 3, SIG 5). At the same time, the pulse input signal derived from the signal source 2 is smoothed by the low-pass filter 10 (refer to FIG. 3 SIG 6) and supplied to the differential amplifier 15 which generates a difference of output signals of the filter 10 and the subtractor 14 as a pulsatory power error signal.

Provided that the digital input signal is a function $f(t)$ of time $t$, the voltage amplifier of the input signal from the signal source 2 is $V_2$, coefficients of light strength and the photodetected signal of the photodetector 6 are $\kappa$, and a common time constant of low-pass filters 9, 10 is $\tau$, respective portions of signal waveforms are shown by following equations.

$$\text{SIG } 1 = V_2 \cdot f(t) \tag{1}$$

$$\text{SIG } 2 = P_1 + P_2 \cdot f(t) \tag{2}$$

where $P_1$ is low power level of the semiconductor laser and $P_2$ is contribution component of high power level of the laser to the transistor.

$$\text{SIG } 3 = \kappa \cdot [P_1 + P_2 \cdot f(t)] \tag{3}$$

$$\text{SIG } 4 = \frac{1}{\tau} \int_0^t \kappa [P_1 + P_2 f(\lambda)] e^{\frac{1}{\tau}(t-\lambda)} d\lambda \tag{4}$$

$$\text{SIG } 5 = \text{SIG } 4 - V_{1S} \tag{5}$$

where $V_{1S}$ is a reference signal.

$$\text{SIG } 6 = \frac{1}{\tau} \int_0^t V_2 \cdot f(\lambda) \cdot e^{\frac{1}{\tau}(t-\lambda)} d\lambda \tag{6}$$

If $P_1 = V_{1S}$ $$\text{SIG 4} = V_{1S}\left(1 - e^{\frac{t}{\lambda}}\right) + \frac{1}{\tau}\int_0^t \cdot P_2 \cdot f(\lambda) \cdot e^{\frac{1}{\tau}(t-\lambda)} d\lambda \quad (4)'$$

Then, $e^{-t/}$ becomes Zero with very fast so that $$\text{SIG 4} \simeq V_{1S} + \frac{1}{\tau}\int_0^t \kappa \cdot P_2 \cdot f(\lambda) \cdot e^{\frac{1}{\tau}(t-\lambda)} d\lambda \quad (4)''$$

$$\text{SIG 5} \simeq \frac{1}{\tau}\int_0^t \kappa \cdot P_2 f(\lambda) e^{\frac{1}{\tau}(t-\lambda)} d\lambda \quad (5)'$$

$P_2$ is very slowly changed with time, so that $$\text{SIG 5} \simeq \frac{\kappa \cdot P_2}{\tau}\int_0^t f(\lambda) e^{\frac{1}{\tau}(t-\lambda)} d\lambda \quad (5)''$$

Provided that $V_2$ is not changed in equation (6), following equation is obtained.

$$\text{SIG 6} = \frac{V_2}{\tau}\int_0^t f(\lambda) \cdot e^{\frac{1}{\tau}(t-\lambda)} d\lambda \quad (6)'$$

If the gain of the amplifier is $\alpha_2$, the output voltage $dV_2$ of the amplifier 15 can be shown by following equation.

$$dV_2 = 2(V_2 - {'P_2})g(t) \quad (7)$$

$$g(t) = \frac{1}{\tau}\int_0^t f(\lambda) e^{\frac{1}{\tau}(t-\lambda)} d\lambda \quad (8)$$

If voltage set value of upper and lower limits of the window comparator 16 are $V_{2u}$ and $V_{2L}$, $V_2 = \kappa \cdot P_2$ then, $dV_2 = 0$. When $P_2$ becomes larger than the reference (that is, $dV_2 < V_{2L}$), the counter 21 performs down counting so that the set current of a constant current becomes small thereby reducing $P_2$. In the reverse case, similar control is performed in such a manner that $\kappa \cdot P_2$ is within the range of the above upper and lower limits. At the high power continuous oscillation, if $f(t) = 1$, the similar control can be obtained.

Figure 4:
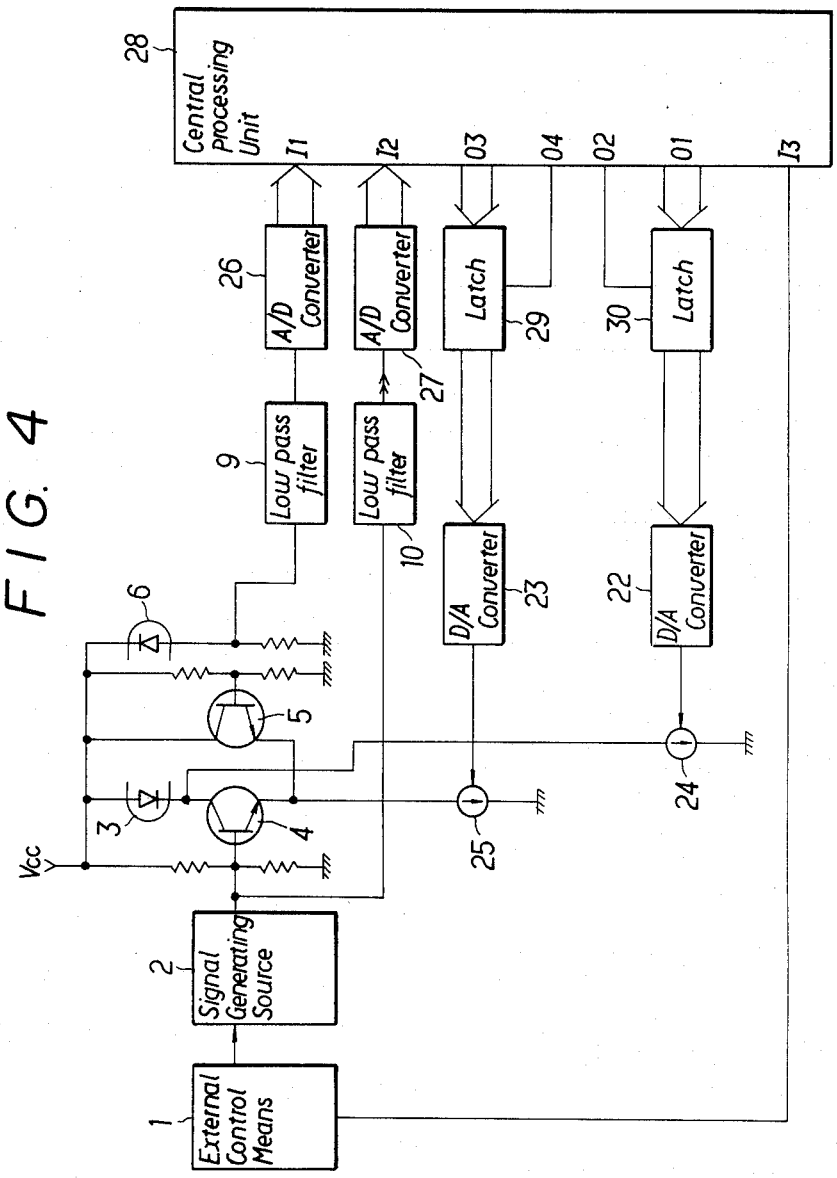
FIG. 4 is a circuit diagram showing the other embodiment of the optical power stabilizing device according to the present invention.

FIG. 4 shows another embodiment of the optical power stabilizing device according to the present invention. The major part of the device is the same as FIG. 2 and only the differences will be described. In this embodiment the output signal of the photodetector 6 is supplied to the low-pass filter 9. Reference numerals 26 and 27 are A/D converters, 28 is a CPU, 29.30 are latch circuits. The output of the detector 6 is supplied to the low-pass filter 9 to generate an output signal as shown by the equation (4) which is supplied to an A/D converter 26 to convert the input signal into digital signals. The input signal derived from the signal source 2 is supplied to an A/D converter 27 through the low-pass filter 10 to convert the input signal into digital signals. These digital signals are supplied to a CPU 28 which forms a control signal generating means and performs operational process. The output of the CPU 28 are supplied through latch circuits 29 and 30 to constant current sources 24 and 25 which form a drive means for the light source, thereby stabilizing the optical power.

Figure 5:
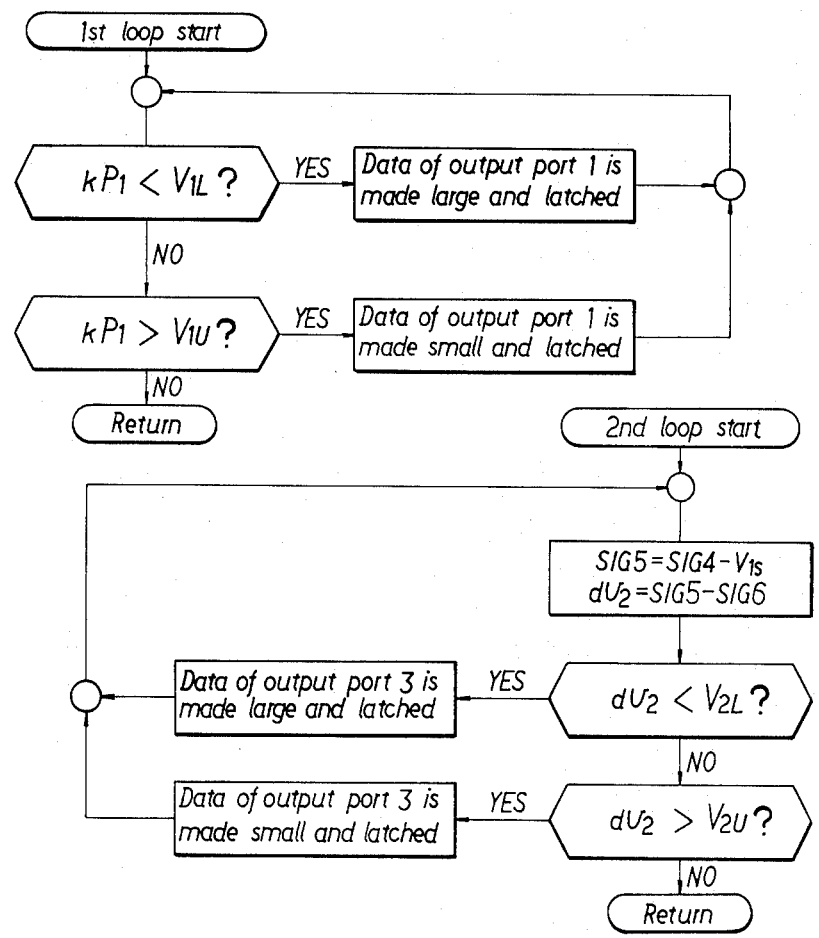
FIG. 5 is a flow chart illustrating an operational flow of a CPU shown in FIG. 4.

FIG. 5 shows an operational flow chart for the CPU 28. When the laser element 3 is oscillated at low power continuous light mode, the operation is followed to first loop of the flow chart and when the laser element 3 is oscillated at high power continuous light mode or pulsatory light mode, the operation is followed to second loop of the flow chart.

At the low power continuous light oscillation mode, the equation (4) becomes $f(\lambda) = 0$, so that the output data of the A/D converter 26 supplied to the CPU 28 is $\kappa \cdot P_1$ in accordance with the rate at which the exponential function converges into zero. When $P_1 < V_{1L}$, the data supplied to the latch 30 is made large to latch the circuit 30. The set current of the current source 24 becomes large in accordance therewith and thus $\kappa \cdot P_1$ becomes large, resulting in a control of the light power. At the pulsatory oscillation and high power continuous light oscillation mode, the operation is followed to second loop while the last data of the first loop shown in FIG. 5 remains at the latch 30. In the second loop, as in the first embodiment, the error signal $dV_2$ calculated by the SIG 4 supplied to the A/D converter 26 and the SIG 6 supplied to the A/D converter 27. If the signal $dV_2$ is larger than the upper limit data $V_{2U}$, the data supplied to the latch 29 is made small thereby latching it at the circuit 29 so that the set current of the current source 25 is decreased in accordance therewith, resulting in a control of stabilized light power.

What is claimed is:

1. An optical power stabilizing device for generating stabilized light power comprising a light source for generating light power having switchable light emitting quantities of a first level and a second level larger than the first level, a photodetecting means coupled to said light source for detecting at least a part of the light power of said light source to generate a photodetected signal, means for driving said light source, a signal source for generating input signals, means for generating at least one control reference signal by processing said input signals, a first feedback loop control circuit for feeding back to said means for driving said light source the output of said photodetecting means at the light power of said first level by comparing it with said control reference signal, and a second feedback loop control circuit for feeding back to said means for driving said light source the output of said photodetecting means at the light power of said second level, said second feedback loop control means comprising first low-pass filter means for filtering said photodetected signal, second low-pass filter means for filtering said input signals, a subtractor means connected to said first low-pass filter means for subtracting the output thereof from the control reference signal, and a differential amplifier connected to said subtractor means and said second low-pass filter means for comparing the output of said subtractor and the output of said second low-pass filter means.

2. An optical power stabilizing device as claimed in claim 1, wherein each of said first and second feedback loop control circuits comprises a first window comparator connected to said means for generating a control reference signal for generating a digital output, a second window comparator connected to said differential amplifier for generating a digital output, a first and second counter means connected to said first and second window comparators, respectively, for counting the output of said respective window comparators and first and second D/A converters connected to said first and second counter means respectively, for converting the digital outputs of said counters means into analog signals.

3. An optical power stabilizing device as claimed in claim 1, wherein it further comprises an analog switch connected between said photodetecting means, and said second low-pass filter means for switching over said photodetecting means and said second low-pass filter means.

4. An optical power stabilizing device as claimed in claim 1, wherein said output power having said first level is a weak continuous laser oscillating mode and said output power having said second level is a strong continuous laser oscillating mode or a pulsatory mode.

5. An optical power stabilizing device as claimed in claim 1, wherein said output power having said first level is a reproducing mode in an optical memory device and said output power having said second level is a recording mode or an erasing mode in said optical memory device.

6. An optical power stabilizing device as claimed in claim 1, wherein said light source driving means comprises a first constant current or voltage source capable of changing setting current or voltage thereof for supplying continuous driving current or voltage to the light source, and a second constant current or voltage source capable of changing setting current or voltage thereof for supplying modulated driving current or voltage to said light source in accordance with said input signals.

7. An optical power stabilizing device as claimed in claim 1 wherein said means for generating at least one control reference signal comprises a central processing unit, and signal holding means for temporarily holding the photodetected signal or the output of said second low-pass filter means.

8. An optical power stabilizing device for generating stabilized light power comprising a signal source for generating input signals, a light source receiving said input signals, phto-detecting means coupled to said light source for detecting at least a part of the light power of said light source to generate a photo-detected signal, first low pass filter means for an output signal of said photodetecting means, second low pass filter means for said input signals, means for generating a reference signal, first differential amplifier means for receiving said reference signal and said photodetected signal, first window comparator means receiving the output of said first differential amplifier means, subtractor means for generating a difference between said reference signal and the output of said first low pass filter means, second differential amplifier means receiving the output of said second low pass filter means and said subtractor means, second window comparator means receiving the output of said second differential amplifier means, clock signal generating means, first AND gate means having an input connected with said clock signal generating means and an input connected with said first window comparator means, second AND gate means having an input connected with said clock signal generator means and an input connected with said second window comparator means, first and second up/down counter means connected respectively to said first and second AND gate means, first and second D/A converter means connected respectively to said first and second up/down counter means and constant current sources for supplying driving current to said light source in accordance with the output of said first and second D/A converter means.

9. An optical power stabilizing device according to claim 8, further comprising analog switch means between said means for generating a reference signal and said first differential amplifier means and said first low pass filter means and external control means for controlling said analog switch means to select modes of operation.

10. An optical power stabilizing device for generating stabilized light power comprising a signal source for generating input signals, a light source receiving said input signals, photodetecting means coupled to said light source for detecting at least a part of the light power of said light source to generate a photo-detected signal, first low pass filter means for an output signal of said photodetecting means, second low pass filter means for said input signals, first and second A/D converter means connecting said first and second low pass filter means respectively with a central processing unit for comparing and processing the A/D converted outputs of said first and second low pass filter means, first latch means connecting a first output of said central processing unit with a first D/A converter means, second latch means connecting a second output of said central processing unit with a second D/A converter means and constant current sources for supplying driving current to said light source in accordance with the output of said first and second D/A converter means.

11. An optical power stabilizing device according to claim 10, further comprising external control means connected to said central processing unit for selecting the modes of operation.

* * * * *